United States Patent
Sylvester et al.

(10) Patent No.: US 6,870,402 B2
(45) Date of Patent: Mar. 22, 2005

(54) TRANSITION-AWARE SIGNALING

(75) Inventors: Dennis M. Sylvester, Ann Arbor, MI (US); Himanshu Kaul, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 10/389,320

(22) Filed: Mar. 14, 2003

(65) Prior Publication Data

US 2005/0030066 A1 Feb. 10, 2005

(51) Int. Cl.[7] ................................................ H03K 5/22
(52) U.S. Cl. ..................... 327/24; 327/319; 327/333; 326/29
(58) Field of Search ............................ 327/24, 29, 319, 327/308, 331, 333, 387; 326/23, 24, 26, 29, 30, 31, 34, 86; 375/214

(56) References Cited

U.S. PATENT DOCUMENTS

| | | | | |
|---|---|---|---|---|
| 5,168,181 A | * | 12/1992 | Baiocchi et al. | 326/26 |
| 5,945,850 A | * | 8/1999 | Segan et al. | 327/24 |
| 6,177,819 B1 | * | 1/2001 | Nguyen | 327/112 |
| 6,262,607 B1 | * | 7/2001 | Suzuki | 327/112 |
| 6,320,408 B1 | * | 11/2001 | Kwong | 326/31 |

* cited by examiner

*Primary Examiner*—Tuan T. Lam
(74) *Attorney, Agent, or Firm*—Rader, Fishman & Grauer PLLC

(57) ABSTRACT

An improved receiver circuit for use on an integrated chip is disclosed. The receiver circuit is interposed in an interconnect line between electrical components in an integrated circuit. The receiver circuit has a transition detection circuit that generates a transition signal in response to a detection of a transition from a first state to a second state on the interconnect line and further generates the transition signal in response to a detection of a transition from the second state to the first state on said interconnect line. The receiver further includes an output signal control circuit that, in response to the transition signal, selectively outputs either a present state of said interconnect line or a next state of the interconnect line stored in the receiver.

30 Claims, 2 Drawing Sheets

TRANSITION-AWARE SIGNALING

BACKGROUND

The present invention relates to signaling techniques over interconnects on an integrated circuit.

This invention was made with government support under subcontract #SA3274JB of grant MDA972-99-1-0001 from Prime Contractor DARPA. The government has certain rights in the invention.

A current trend in integrated chip technology is to include more and more functionality into integrated chips. As a result, there is a general trend toward increasing the overall physical size of integrated chips, as well as decreasing the size of the electrical components and interconnects that reside on the chips. Consequently, on-chip signals must be sent across increasingly more resistive and longer interconnects, which causes the signal propagation delay time between electrical components on the chip to increase. However, it is desirable to at least maintain, if not reduce, the signal propagation delay time between electrical components to maintain and/or improve performance of the chip.

A known approach to reduce signal propagation delay over an interconnect line on integrated chips is to insert repeaters into the interconnect line between the output of one electrical component and the input to the next electrical component in the circuit. The repeaters throughout the interconnect line boost the signal level to reduce its propagation delay. However, repeaters themselves take up physical space on the integrated chip, which results in further increased chip size and additional complexity in laying out the circuit on the chip. Further, the repeaters require power, which increases the overall power consumption of the integrated chip.

Thus, the inventors hereof have recognized the need for an improved method and system for signaling across an integrated chip.

SUMMARY

An improved receiver circuit for use on an integrated chip is disclosed. The receiver circuit is interposed in an interconnect line between electrical components in an integrated circuit. The receiver circuit has a transition detection circuit that generates a transition signal in response to a detection of a transition from a first state to a second state on the interconnect line. The receiver further includes an output signal control circuit that, in response to the transition signal, selectively outputs either a present state of said interconnect line or a next state of the interconnect line, wherein a signal indicative of the next state is stored in the receiver circuit prior to the transition on the interconnect line.

DETAILED DESCRIPTION OF AN EMBODIMENT

Figure 1A:
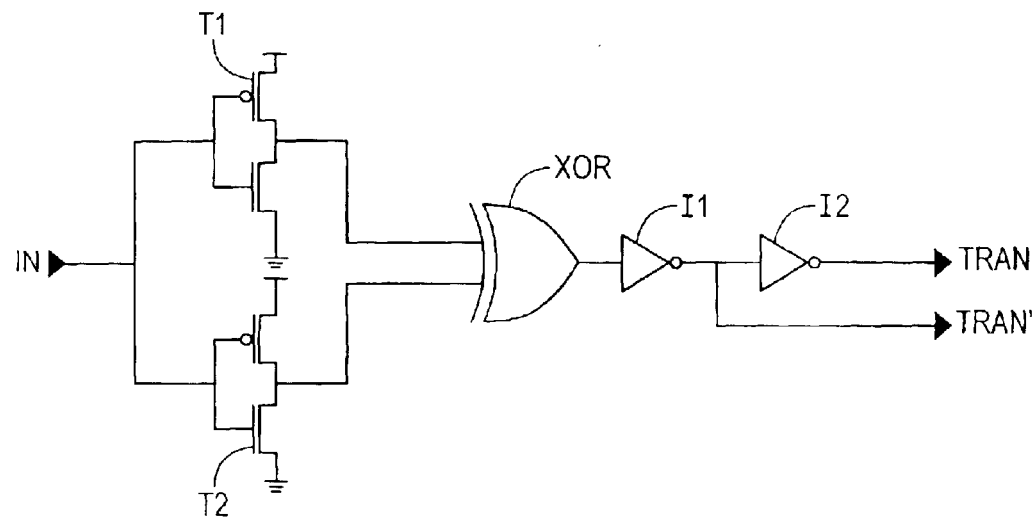
FIG. 1A illustrates an exemplary transition detection portion of a receiver circuit, according to an embodiment of the present invention.
Figure 1B:
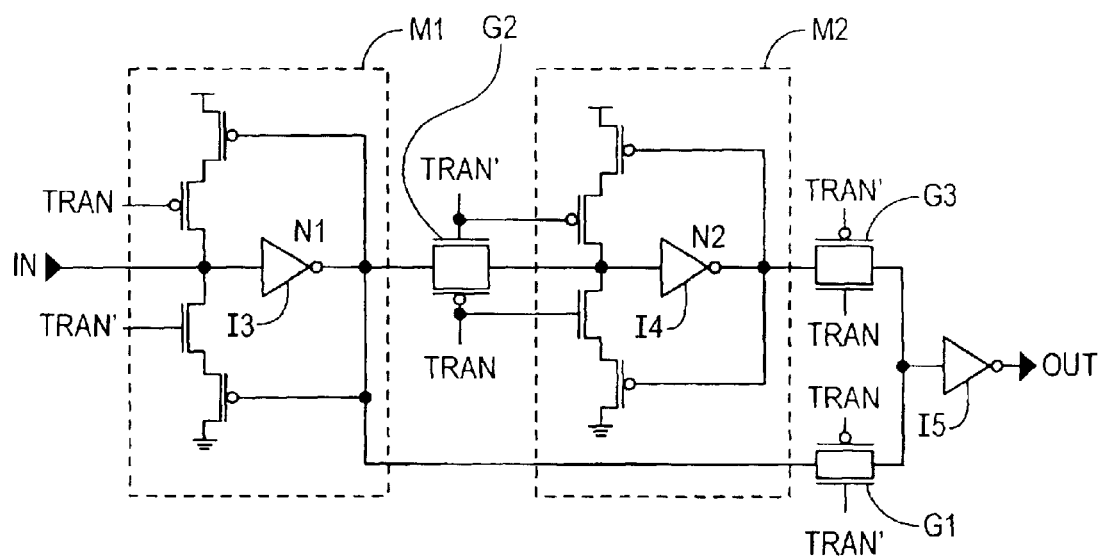
FIG. 1B illustrates an exemplary output signal control portion of a receiver circuit, according to an embodiment of the present invention.

FIGS. 1A and 1B together illustrate an exemplary embodiment of a transition-aware signal receiver of the present invention. The receiver is preferably configured to be positioned at the end of an interconnect line on an integrated circuit between two electrical components on the chip. While the receiver can be positioned anywhere in the interconnect line, its benefits are best achieved if the receiver is positioned close to the input port of the next electrical component on the chip. Generally speaking, the receiver locally stores the current digital state (i.e., either a "high" or "low") on the interconnect line and the complementary digital state. When the digital state on the interconnect line begins to transition, the receiver senses the fact that a transition on the interconnect line is occurring and immediately changes the output signal of the receiver (which is provided as input to the next electrical component on the chip) to the next digital state using the locally-stored complementary digital state, even though the actual transition on the interconnect line is not complete. As a result, the signal propagation delay is decreased because the new output state of the receiver is stored locally, and the output of the receiver is relatively independent of the input slew rate. In FIGS. 1A and 1B, the signal "IN" is the input signal to the receiver, which is taken from the end of the interconnect line (originating at the output of an electrical component on the chip), and the signal "OUT" is the output signal of the receiver, which is provided to the next electrical component on the integrated chip.

FIG. 1A illustrates an embodiment of a transition-sensing portion of the exemplary receiver. The input signal "IN" (from the interconnect line) is provided to two inverters, T1 and T2. The two inverters T1 and T2 are skewed, such that one of the inverters is skewed to have a high switching threshold (such as 70% of the transition height) and the other inverter is skewed to have a low switching threshold (such as 30% of the transition height). Thus, one of the inverters T1, T2 switches its output state when the low switching threshold level is reached by the transitioning signal on the interconnect line, and the other inverter switches its output state when the high switching threshold is met. The outputs of the inverters T1 and T2 feed the inputs of the XOR (exclusive OR) gate. Accordingly, the output of the XOR gate is "high" when the input signal IN is between the low threshold and the high threshold (for example, between 30% and 70% of the signal height). The output of the XOR gate is passed through inverters 11 and 12 to generate signals TRAN, and its complement, TRAN'. The output signal TRAN is "high" when the input signal IN (from the interconnect line) is transitioning, and TRAN is "low" when the input signal IN is not transitioning. More particularly, TRAN is "high" when the transition is between the low switching threshold and the high switching threshold, and TRAN is "low" when the transition is outside of this range and when the line is quite. Signals TRAN and TRAN' are used as control signals for the circuitry that comprises the remaining portion of the exemplary receiver, as illustrated in FIG. 1B.

FIG. 1B illustrates the portion of the exemplary receiver that locally stores a signal indicative of the "next" digital state to be output by the receiver. This portion of the receiver primarily includes two tri-state inverters M1 and M2 and transmission gates G1, G2, and G3. As in FIG. 1A, the input signal, IN, is received from the interconnect line and is provided to tri-state inverter M1. The output of tri-state inverter M1 is provided as an input signal to tri-state inverter M2 through transmission gate G2 and as an input to transmission gate G1. The output of tri-state inverter M2 is provided to transmission gate G3. Control signals TRAN and TRAN' enable and disable, depending upon the states of TRAN and TRAN', the transmission gates G1, G2 and G3 and tri-state inverters M1 and M2. The outputs of transmission gates G1 and G3 are multiplexed and alternatively passed through inverter 15. The output of inverter 15 comprises the output signal of the receiver circuit, OUT, which is provided as input to the next electrical component on the chip. As explained in more detail below, node N1 (at the output of inverter 13) holds the complementary state to the present state on the interconnect line (i.e., input signal IN). Node N2 (at the output of inverter 14) holds the current state on the interconnect line (i.e., input signal IN). The signal state at Node N1 is provided through inverter 15 when the interconnect line is quiet to generate output signal OUT, which matches the state on the interconnect line (i.e., input signal IN). When a transition of the input signal IN is detected, the signal state at Node N2 is provided through inverter 15 to generate output signal OUT, which is the complement to the previous state of output signal OUT. Thus, the signal held at node N2 is directly used to generate the complement to the current output signal OUT, i.e., the signal at node N2 is indicative of the complement of output signal OUT. Transmission gates G1 and G3 together act as a multiplexer for the input signal (from Node N1 and Node N2) to inverter 15, which ultimately generates output signal OUT.

Figure 2:
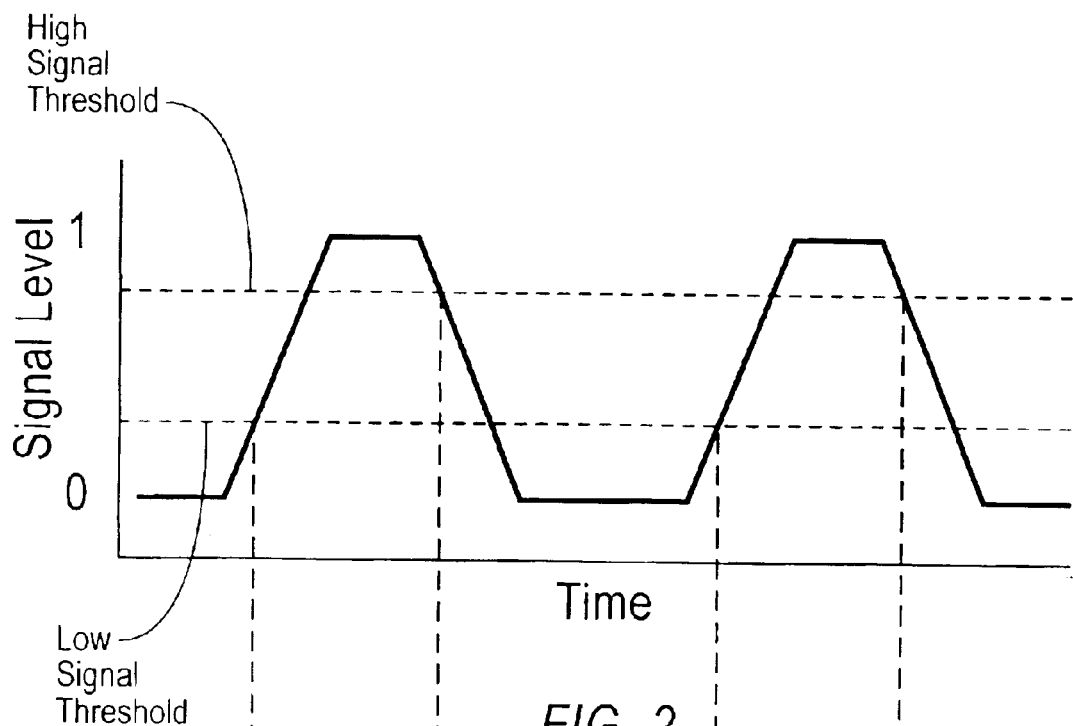
FIG. 2 illustrates an exemplary data pulse train that may be carried on an interconnect line on an integrated circuit.
Figure 3:
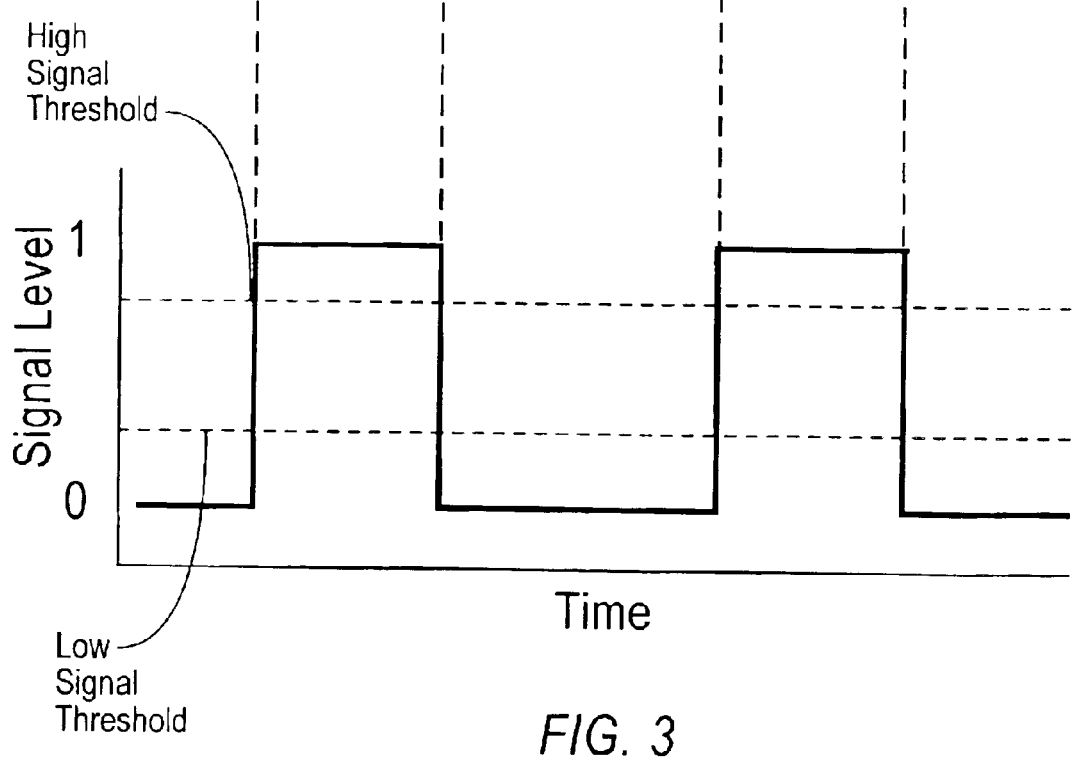
FIG. 3 illustrates an exemplary output pulse train from an exemplary receiver circuit having the pulse train of FIG. 2 as input.

Now, with continuing reference to FIGS. 1A, 1B and with reference to FIGS. 2 and 3, operation of the exemplary receiver will be described. FIG. 2 illustrates a portion of an exemplary data pulse train on an interconnect line on an integrated chip, the end of which being connected to the exemplary receiver described herein. FIG. 3 illustrates the output of the exemplary receiver in response to the data pulse train in FIG. 2 as input to the receiver. By way of example, assume that the state on the interconnect line begins as "low" or "0", as illustrated on the far left side of FIG. 2. At this point, because there is no transition occurring, the output of the XOR gate (FIG. 1A) is "0", and thus the TRAN signal is "0" and TRAN' is "1". As a result, transmission gates G1 and G2 are open, and transmission gate G3 is closed, thereby causing the input signal to inverter 15 to have the state at node N1 (at the output of inverter 13), which is the complement to the state on the interconnect line. Therefore, the output signal OUT is the same state as the state on the interconnect line (i.e., input signal IN). Thus, as shown in FIG. 3, the output signal OUT is "low" or "0" when the input signal IN is "low" or "0". The output signal, OUT, of the receiver is held by the signal state on the interconnect line (i.e., input signal IN) because there is no signal transition occurring on the interconnect line. Node N2 is holding the complementary state of Node N1, i.e., "high" or "1", since tri-state inverter M1 and transmission gate G2 are enabled. Further, node N2 is isolated from the output terminal of the receiver because transmission gate G3 is disabled.

When the state on the interconnect line begins to transition to a "high" or "1" level, the inverter T1 or T2 (in FIG. 1A) skewed toward the lower signal threshold changes state when the signal height on the interconnect line passes the lower threshold. Consequently, the output of the XOR gate changes to "1", and thus the TRAN signal becomes "1" and TRAN' becomes "0", indicating that a signal transition has been detected. With TRAN being "1" and TRAN' being "0", transmission gate G1 closes and transmission gate G3 opens, thereby causing the input signal to inverter 15 to take on the value of node N2, which is holding the complementary signal state to node N1. Therefore, the output signal OUT changes from "0" to "1". In this way, the output signal, OUT, takes on the next signal state when a signal transition is detected on the interconnect line without having to wait for the entire interconnect line to be driven high enough to drive the next electrical component in the circuit. Further, with the TRAN signal being "1" and TRAN' being "0", tri-state inverter M1 is disabled and transmission gate G2 is off. Therefore, the signal at node N2 is isolated from and unaffected by the changing signal on the interconnect line (i.e., input signal IN). Thus, the output signal OUT continues to reflect the signal held at N2 until the transition of the signal on the interconnect line (i.e., input signal IN) reaches the high signal threshold.

When the transition of the signal on the interconnect line (i.e., input signal IN) reaches the high signal threshold, the second skewed inverter T1 or T2 (FIG. 1A) detects the transition of input signal IN on the interconnect line, and thus changes state such that the outputs of both T1 and T2 are the same. Consequently, the output of XOR gate goes back to "0", and therefore, the TRAN signal becomes "0" and TRAN' becomes "1". When TRAN becomes "0" and TRAN' becomes "1", transmission gate G1 opens and transmission gate G3 closes. Consequently, the state at Node N1 is passed through inverter 15 to generate output signal OUT, which is the same as the state on the interconnect line (i.e., input signal IN). Additionally, tri-state inverter M2 is disabled, tri-state inverter M1 is enabled, and transmission gate G2 is turned on. As a result, the state at node N2 changes to the complementary state of the state at node N1. Again, because transmission gate G3 is "off", the signal state at node N2 (complementary to the state at Node N1) is isolated from and does not affect the output signal OUT. Thus, the signal state at node N2 (complementary to the state at Node N1) is stored until the next transition of the signal on the interconnect line is detected. The above-described operation is repeated when the signal on the interconnect line (i.e., input signal IN) begins its next transition.

The exemplary receiver described hereinabove is advantageous because, by essentially anticipating the signal level at the end of a transition on an interconnect line (by holding the next state locally), the receiver increases the signal propagation performance on the interconnect line with less need for repeaters interposed throughout the interconnect line. The decreased need for repeaters on the integrated chip frees up physical space on the chip. Furthermore, the elimination of a number of repeaters from the chip decreases the overall power consumption of the chip. One skilled in the art will recognize other benefits of the exemplary receiver disclosed above.

While the invention has been described in reference to a particular embodiment thereof, the invention may be embodied in other specific forms without departing from its spirit or essential characteristics. By way of example only, one skilled in the art will recognize many equivalent structures and devices for storing the next state of the interconnect line, such as flip flop circuits, memory devices, etc. Further, one skilled in the art will recognize many equivalent structures and devices for detecting the transition on an interconnect line. Accordingly, the described embodiment is to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A receiver circuit, comprising:
    an input configured to be connected to a first node on an integrated circuit;
    an output configured to be connected to a second node on an integrated circuit, said first node being electrically separate from said second node;
    a control signal indicative of an occurrence of a transition from a first state to a second state on an interconnect line in an integrated circuit;
    an output signal configured to alternatively have a current state and a complementary state;
    a means for storing a signal indicative of said complementary state prior to said transition on said interconnect line; and
    wherein said output signal changes from said current state to said complementary state in response to said control signal.

2. The receiver circuit of claim 1, wherein:
    said storage means comprises an electrical node configured to take on a signal indicative of said complementary state; and
    further comprising a means for selectively causing said output signal to take on said complementary state in response to said electrical node and said control signal.

3. The receiver circuit of claim 2, wherein said means for selectively causing said output signal to take on said complementary state comprises a transmission gate that is responsive to said electrical control signal.

4. The receiver circuit of claim 1, further comprising a means for isolating said storage means from said interconnect line during said transition on said interconnect line.

5. The receiver circuit of claim 4, wherein said isolation means is responsive to said control signal.

6. The receiver circuit of claim 5, wherein said isolation means comprises a transmission gate responsive to said control signal.

7. The receiver circuit of claim 1, further comprising a means for selectively causing said output signal to alternatively take on said first state on said interconnect line and said complementary state in response to said stored signal and said control signal.

8. The receiver circuit of claim 7, wherein said means for selectively causing said output signal to alternatively take said first state on said interconnect line and said complementary state comprises a first transmission gate positioned between said storage means and said output signal and a second transmission gate positioned between said interconnect line and said output signal, both said first transmission gate and said second transmission gate being responsive to said control signal.

9. The receiver circuit of claim 1, wherein said control signal represents a portion of said transition between a lower switching threshold and a higher switching threshold.

10. The receiver circuit of claim 9, further comprising a means for generating said control signal during said portion of said transition.

11. The receiver circuit of claim 10, wherein said generating means comprises a first inverter skewed to change its output state at said lower switching threshold; and wherein said generating means further comprises a second inverter skewed to change its output state at said higher switching threshold.

12. The receiver circuit of claim 11, wherein said lower switching threshold is approximately between about 20% and 40% of the signal height, and wherein said lower switching threshold is approximately between about 60% and 80% of the signal height.

13. The receiver circuit of claim 11, wherein said generating means further comprises an exclusive OR gate that generates said control signal in response to outputs of said first and second inverters.

14. A receiver circuit interposed in an interconnect line between electrical components in an integrated circuit, comprising:
    an input configured to be connected to a first node on an integrated circuit;
    an output configured to be connected to a second node on an integrated circuit, said first node being electrically separate from said second node;
    a transition detection circuit that generates a transition signal in response to a detection of a transition from a first state to a second state at said first node; and
    an output signal control circuit that selectively outputs either a present state of said interconnect line or a next state of said interconnect line to said second node in response to a stored signal indicative of said next state and in response to said transition signal.

15. The receiver circuit of claim 14, wherein said output control circuit further comprises:
    a first transmission gate configured to selectively allow a present state on said interconnect line to control said output of said output signal control signal control circuit; and
    a second transmission gate configured to selectively allow said stored signal to control said output of said output signal control circuit.

16. The receiver circuit of claim 14, wherein said output signal control circuit further comprises a transmission gate that isolates said stored signal from said interconnect line in response to said transition signal.

17. The receiver circuit of claim 15, further comprising a third transmission gate that isolates said stored signal from said interconnect line when said second transmission gate is allowing said stored signal to control said output of said output signal control circuit.

18. The receiver circuit of claim 14, wherein said transition detection circuit comprises a first inverter skewed to change its output state at a lower switching threshold; and wherein said generating means further comprises a second inverter skewed to change its output state at a higher switching threshold.

19. The receiver circuit of claim 18, wherein said lower switching threshold is approximately between about 20% and 40% of the signal height, and wherein said lower switching threshold is approximately between about 60% and 80% of the signal height.

20. The receiver circuit of claim 18, wherein said transition detection circuit further comprises an exclusive OR gate that generates said electrical transition signal in response to outputs of said first and second inverters.

21. A method of signaling over an interconnect line on an integrated chip, comprising:
    interposing a receiver circuit between at least two electrical nodes of an interconnect line in an integrated circuit;
    outputting a first generated signal state from said receiver circuit;
    storing a signal indicative of a complementary state of said first generated signal state;
    detecting a transition from said first generated signal state on the interconnect line; and changing said output from said first generated signal state to said complementary signal state in response to said stored signal and said transition detection.

22. The method of claim 21, wherein said complementary state is output from said receiver prior to completion of said transition from said first state to said complementary state on the interconnect line.

23. The method of claim 21, further comprising the step of isolating said output from said interconnect line while said complementary state is being output in response to said stored signal.

24. The method of claim 21, further comprising isolating said stored signal from said interconnect line while said complementary state is being output in response to said stored signal.

25. The method of claim 21, further comprising the step of outputting said complementary state from said interconnect line when said transition from said first state to said complementary state on said interconnect line has passed an upper switching threshold.

26. The method of claim 21, further comprising isolating said output of said receiver from said stored signal when said transition from said first state to said complementary state on said interconnect line has passed an upper switching threshold.

27. The method of claim 21, further comprising the step of storing a signal indicative of said first state when said transition from said first state to said complementary state on the interconnect line has passed an upper switching threshold.

28. The method of claim 21, wherein said detecting step comprises detecting when said transition between said first state and said complementary state on said interconnect line is between a lower switching threshold level and a higher switching threshold level.

29. The method of claim 28, wherein said detecting step further comprises comparing the output of a first skewed inverter configured to change its output signal when said transition is at said lower threshold to the output of a second skewed inverter configured to change its output signal when said transition is at said upper switching threshold.

30. The method of claim 29, further comprising applying said outputs of said first and second skewed inverters to an exclusive OR gate.

* * * * *